(12) United States Patent
Shen et al.

(10) Patent No.: US 12,543,557 B2
(45) Date of Patent: Feb. 3, 2026

(54) SYSTEM AND METHOD TO REDUCE LAYOUT DIMENSIONS USING NON-PERPENDICULAR PROCESS SCHEME

(71) Applicant: Taiwan Semiconductor Manufacturing Co., Ltd., Hsinchu (TW)

(72) Inventors: Yu-Tien Shen, Hsinchu (TW); Ken-Hsien Hsieh, Hsinchu (TW); Shih-Ming Chang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 760 days.

(21) Appl. No.: 17/566,564

(22) Filed: Dec. 30, 2021

(65) Prior Publication Data

US 2022/0399272 A1 Dec. 15, 2022

Related U.S. Application Data

(60) Provisional application No. 63/210,420, filed on Jun. 14, 2021.

(51) Int. Cl.
*H01L 23/528* (2006.01)
*H01L 21/311* (2006.01)
*H01L 21/768* (2006.01)

(52) U.S. Cl.
CPC .... *H01L 23/5283* (2013.01); *H01L 21/31144* (2013.01); *H01L 21/76802* (2013.01); *H01L 21/76879* (2013.01)

(58) Field of Classification Search
CPC .............. H01L 23/5283; H01L 23/528; H01L 21/31144; H01L 21/76802; H01L 21/76879; H01L 21/76816; H01L 21/0273; H01L 21/0274

See application file for complete search history.

(56) References Cited

U.S. PATENT DOCUMENTS

| | | | | |
|---|---|---|---|---|
| 5,243,377 A | * | 9/1993 | Umatate | G03F 7/70525 355/53 |
| 5,870,176 A | * | 2/1999 | Sweatt | G03F 7/70291 359/872 |
| 7,166,925 B2 | | 1/2007 | Akram | |
| 8,133,804 B1 | * | 3/2012 | Godet | H01J 37/3056 438/528 |
| 8,529,728 B2 | * | 9/2013 | Charatan | G03F 7/40 156/345.24 |

(Continued)

FOREIGN PATENT DOCUMENTS

| | | |
|---|---|---|
| CN | 103853870 A | 6/2014 |
| CN | 108074865 A | 5/2018 |

(Continued)

*Primary Examiner* — Bac H Au
(74) *Attorney, Agent, or Firm* — Seed IP Law Group

(57) ABSTRACT

A semiconductor processing system includes a layout database that stores a plurality of layouts indicating features to be formed in a wafer. The semiconductor processing system includes a layout analyzer that analyzes the layouts and determines, for each layout, whether a non-perpendicular particle bombardment process should be utilized in conjunction with a photolithography process for forming the features of the layout in a wafer.

20 Claims, 14 Drawing Sheets

(56) References Cited

U.S. PATENT DOCUMENTS

| | | | |
|---|---|---|---|
| 8,806,392 B2* | 8/2014 | Chang | G06F 30/398 |
| | | | 716/54 |
| 9,236,267 B2 | 1/2016 | De et al. | |
| 9,502,265 B1 | 11/2016 | Jiang et al. | |
| 9,520,466 B2 | 12/2016 | Holland et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 9,786,774 B2 | 10/2017 | Colinge et al. | |
| 9,853,101 B2 | 12/2017 | Peng et al. | |
| 9,881,993 B2 | 1/2018 | Ching et al. | |
| 10,310,379 B2* | 6/2019 | Ma | H01L 21/266 |
| 2002/0160619 A1* | 10/2002 | Yamada | H01L 21/0273 |
| | | | 438/723 |
| 2003/0054580 A1* | 3/2003 | Yamamoto | G03F 7/7045 |
| | | | 438/22 |
| 2005/0074698 A1* | 4/2005 | Borodovsky | G03F 7/70408 |
| | | | 430/394 |
| 2008/0230511 A1 | 9/2008 | Kim et al. | |
| 2009/0125864 A1* | 5/2009 | Aton | G03F 1/68 |
| | | | 716/50 |
| 2009/0314965 A1* | 12/2009 | Wu | H01L 21/0273 |
| | | | 430/5 |
| 2013/0062309 A1* | 3/2013 | Godet | H01L 21/0273 |
| | | | 216/41 |
| 2013/0080980 A1* | 3/2013 | Wang | G06F 30/398 |
| | | | 716/52 |
| 2014/0272728 A1* | 9/2014 | Sinclair | G03F 7/40 |
| | | | 430/327 |
| 2014/0329385 A1 | 11/2014 | Wu et al. | |
| 2015/0294917 A1 | 10/2015 | deVilliers | |
| 2016/0064239 A1* | 3/2016 | Shih | H01L 21/0273 |
| | | | 438/694 |
| 2017/0178911 A1* | 6/2017 | Ma | H01L 21/76816 |
| 2019/0348279 A1* | 11/2019 | Zhang | H01L 21/31144 |
| 2020/0006078 A1* | 1/2020 | Liu | H01J 37/32623 |
| 2021/0389679 A1* | 12/2021 | Huang | H01L 21/266 |
| 2022/0102139 A1* | 3/2022 | Yang | G03F 7/70058 |
| 2022/0357669 A1* | 11/2022 | Chang | G03F 7/70433 |

FOREIGN PATENT DOCUMENTS

| | | |
|---|---|---|
| KR | 20170143445 A | 12/2017 |
| KR | 20190063430 A | 6/2019 |
| TW | I493373 B | 7/2015 |
| TW | I692700 B | 5/2020 |

* cited by examiner

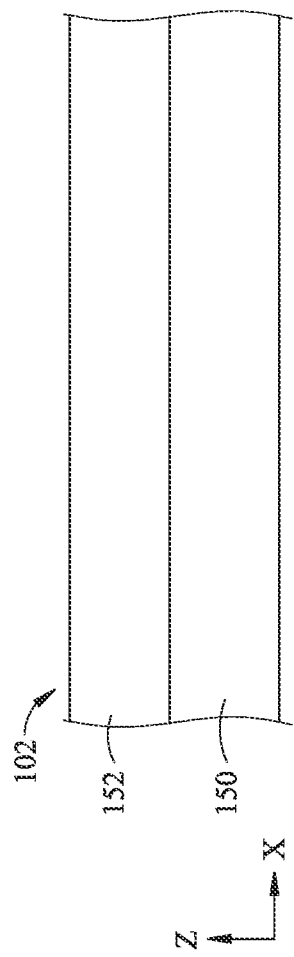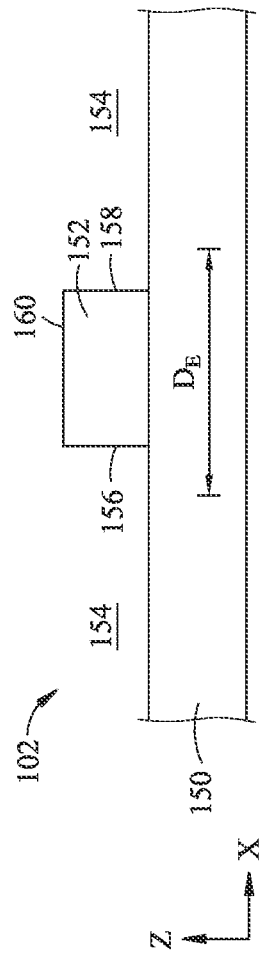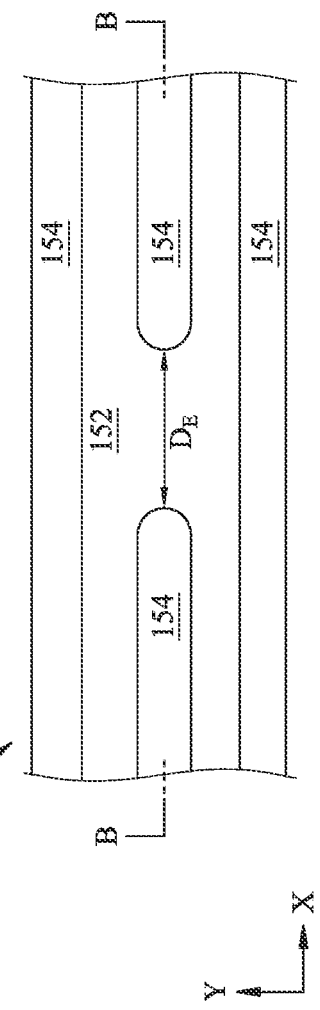

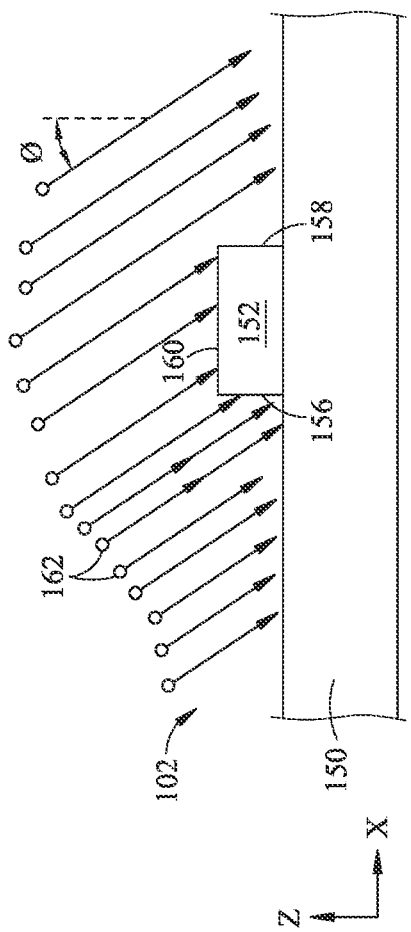
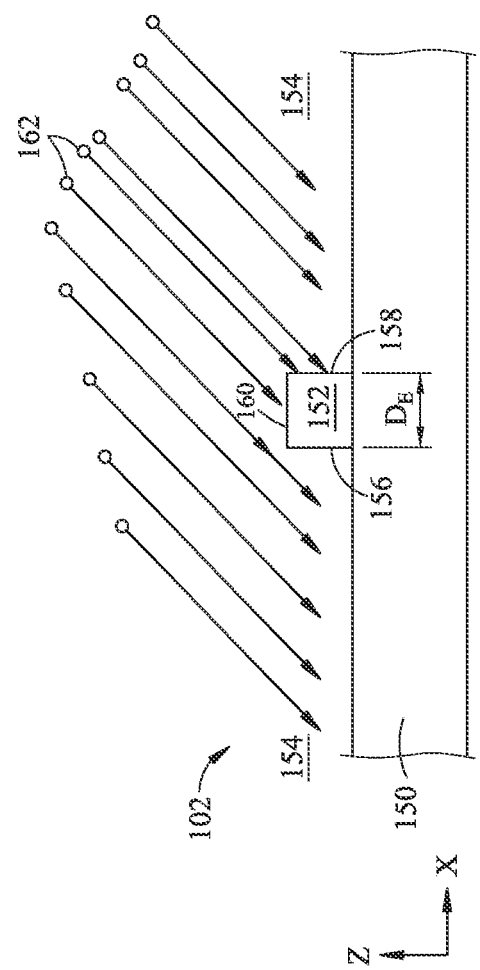

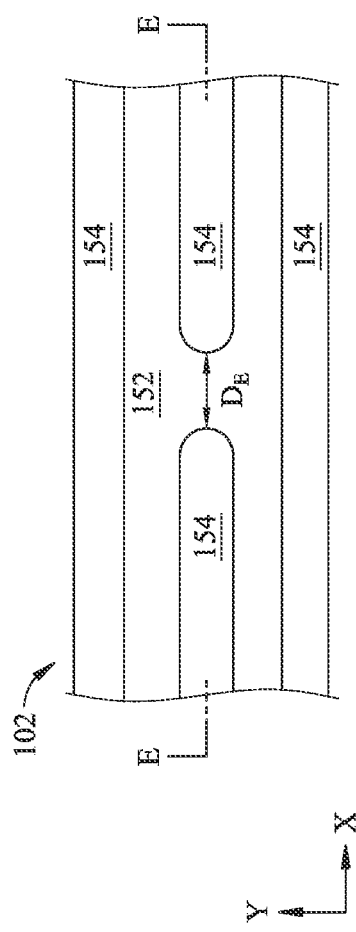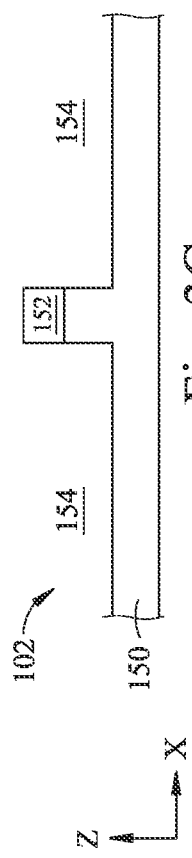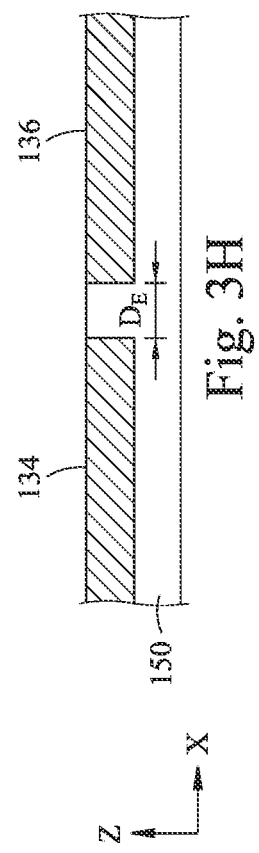

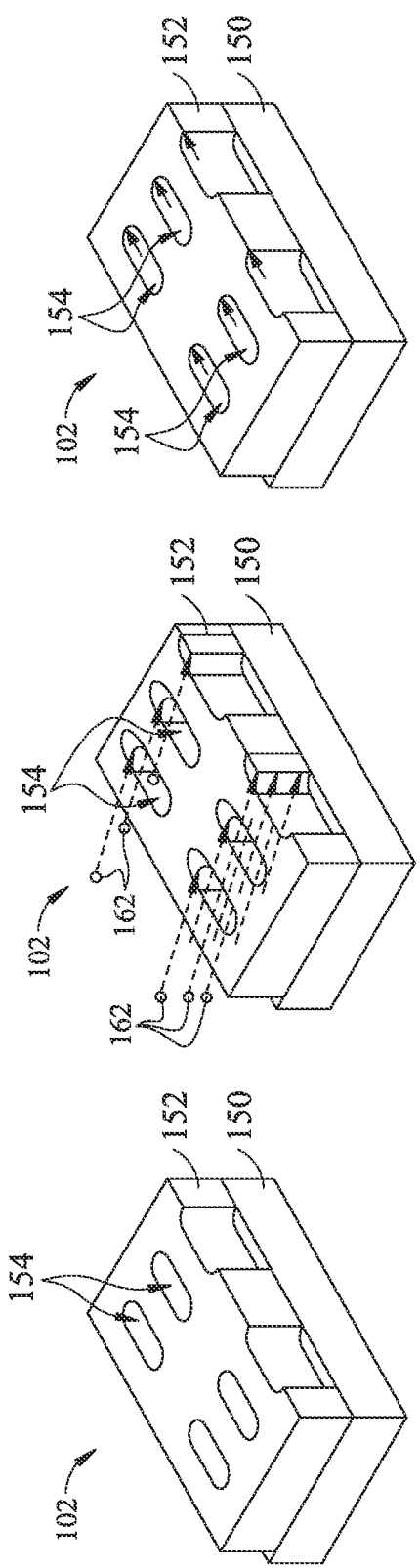

SYSTEM AND METHOD TO REDUCE LAYOUT DIMENSIONS USING NON-PERPENDICULAR PROCESS SCHEME

BACKGROUND

There has been a continuous demand for increasing computing power in electronic devices including smart phones, tablets, desktop computers, laptop computers and many other kinds of electronic devices. One way to increase computing power in integrated circuits is to increase the number of transistors and other integrated circuit features that can be included for a given area of semiconductor substrate.

To continue decreasing the size of features in integrated circuits, various thin-film deposition techniques, etching techniques, and other processing techniques are implemented. Many etching processes involve depositing a layer of photoresist and patterning the photoresist by exposing the photoresist to ultraviolet light through a photolithography mask. The mask includes the pattern to be formed in the photoresist. However, as the size of desired features decreases, it can be difficult to pattern the photoresist in the desired manner.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3I are cross-sectional views and top views of a wafer at various stages of processing, in accordance with some embodiments.

FIGS. 8A-8C are isometric views of a wafer, in accordance with some embodiments.

DETAILED DESCRIPTION

Figure 1:
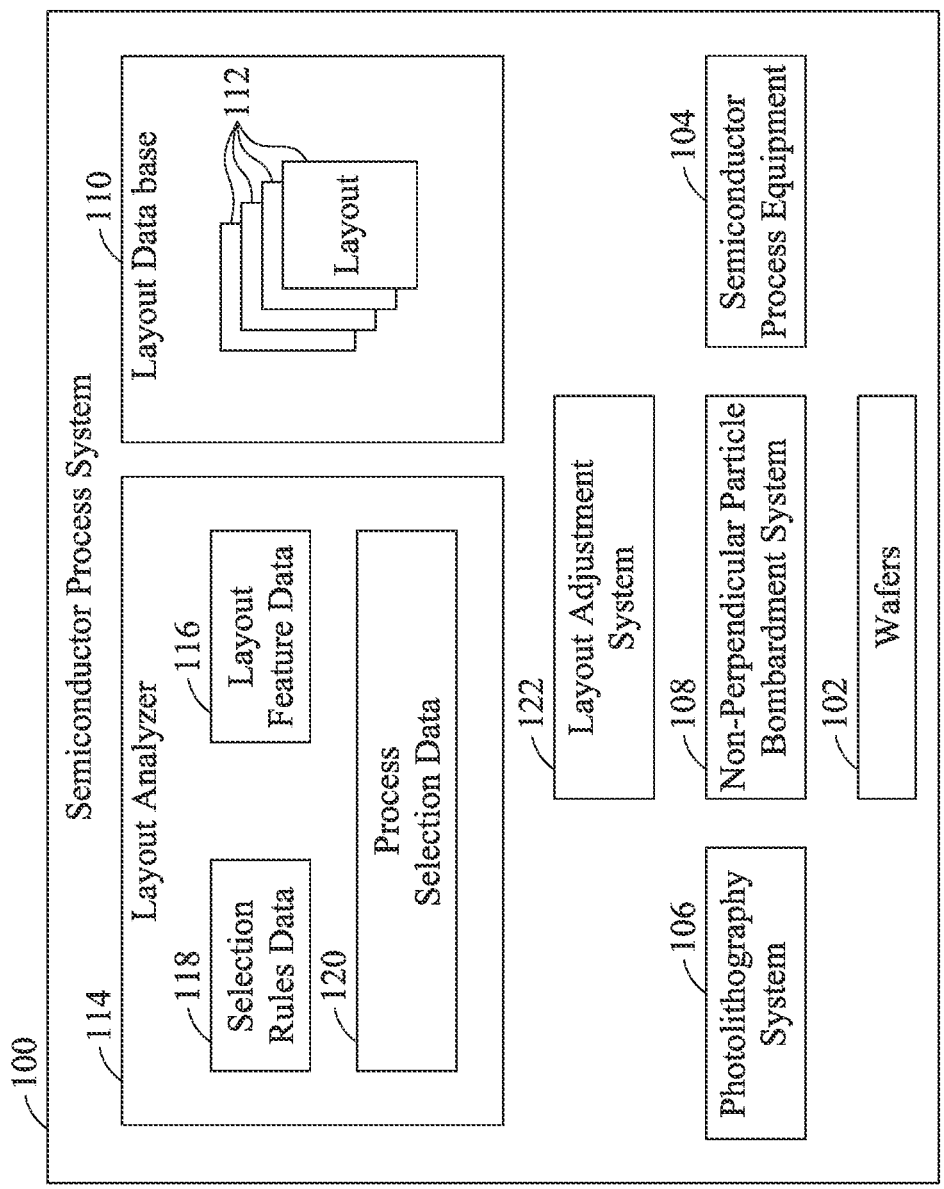
FIG. 1 is a block diagram of a semiconductor process system, in accordance with some embodiments.

In the following description, many thicknesses and materials are described for various layers and structures within an integrated circuit die. Specific dimensions and materials are given by way of example for various embodiments. Those of skill in the art will recognize, in light of the present disclosure, that other dimensions and materials can be used in many cases without departing from the scope of the present disclosure.

The following disclosure provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "some embodiments" or "an embodiment" means that a particular feature, structure or characteristic described in connection with the embodiment is included in at least some embodiments. Thus, the appearances of the phrases "in one embodiment", "in an embodiment", or "in some embodiments" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

Embodiments of the present disclosure provide a semiconductor process system that selects among different patterning processes for each of a plurality of layouts to be utilized in processing semiconductor wafers. The semiconductor process system includes a layout database and a layout analyzer. The layout database includes the layout data associated with various stages of semiconductor processing. The layout analyzer analyzes the distribution and dimensions of features associated with each layout. The layout analyzer compares the layout feature data to selection rules data. The selection rules data determines whether to utilize a non-perpendicular particle bombardment process in addition to a photolithography process to define features associated with the layout. If the non-perpendicular particle bombardment process is selected for a layout, the layout is adjusted to reduce the dimensions between some of the features.

The layout analysis and process selection has various benefits. For example, the non-perpendicular ion-bombardment process can be utilized to overcome pattern scaling limitations of photolithography processes. The result is that layouts are improved, layout features are properly and reliably imparted to wafers, and wafer yields increase.

FIG. 1 is a block diagram of a semiconductor process system 100, in accordance with some embodiments. The semiconductor process system 100 may correspond to a system that processes wafers 102. The semiconductor process system 100 performs a plurality of semiconductor processes on the wafers 102 to form semiconductor layers, dielectric layers, conductive layers, and various other structures or components that result in fully functioning integrated circuits.

The semiconductor process system 100 includes a photolithography system 106. The photolithography system 106 can be utilized to form masks on wafers 102. The masks have patterns selected to implement various layouts of features.

In a photolithography process, the photolithography system 106 may deposit photoresist on a wafer 102. The photolithography system 106 may then irradiate the wafers with photolithography light via a reticle. The reticle has the pattern of the mask to be formed in the photoresist. The photolithography system 106 may direct photolithography light to reflect off of the reticle onto the wafer 102. After the photolithography light has reflected off of the reticle, the photolithography light carries the pattern of the reticle. The photolithography light irradiates the photoresist on the wafer 102 with the pattern of the reticle. The portions of the photoresist that are irradiated by the photolithography light undergo a structural change such that a subsequent etching process either removes the exposed photoresist or the unexposed photoresist, depending on the type of the photoresist. The remaining photoresist corresponds to a mask with the pattern of the reticle.

In some embodiments, the photolithography system 106 imparts the pattern onto the photoresist for forming metal interconnect structures in a wafer 102. The metal interconnect structures may include metal lines extending in a first direction. Some of the metal lines are separated from each other in a second direction perpendicular to the first direction with a side-to-side separation distance. Some of the metal lines are separated from each other along the first direction with an end-to-end separation distance. In some cases, the photolithography system 106 may not be able to generate end-to-end separation distances that are as small as the side-to-side separation distances. In other words, the photolithography system 106 may not be able to generate separation distances between features in the first direction as small as the separation distances between features in the second direction.

In one example, the photolithography system 106 may be able to make side-to-side separation distances greater than or equal to 15 nm. The photolithography system 106 may only be able to make end-to-end separation distances greater than or equal to 30 nm. The larger end-to-end separation distances correspond to greater consumption of wafer area.

In some embodiments, the photolithography system 106 is an extreme ultraviolet (EUV) photolithography system. The EUV photolithography system generates EUV light. As used herein, the terms "EUV light" and "EUV radiation" can be utilized interchangeably. In some embodiments, the EUV light has a wavelength between 10 nm and 15 nm. In one example, the EUV light has a central wavelength of 13.5 nm. In photolithography processes, one of the factors that affects the size of features that can be formed in a wafer is the wavelength of the light utilized in the photolithography processes. Because EUV light has a very small wavelength, EUV light can be utilized to define very small features on the wafer 102. Different EUV generation processes can provide different wavelength ranges of EUV light and different center wavelengths. Accordingly, the EUV light can have different ranges of wavelengths and different center wavelengths than those described above without departing from the scope of the present disclosure. The photolithography system 106 can include photolithography systems other than EUV photolithography systems without departing from the scope of the present disclosure.

In some cases, even the EUV photolithography system may have difficulties generating features with end-to-end separation distances smaller than 30 nm. Accordingly, there may be a greater amount of wafer area wasted in the end-to-end space between features than if the end-to-end separation distances are as small as the side-to-side separation distances described previously.

In order to reduce the end-to-end separation distance between features, the semiconductor process system 100 includes a non-perpendicular particle bombardment system 108. The non-perpendicular particle bombardment system 108 can be utilized in conjunction with the photolithography system 106 to reduce the end-to-end distances between features or to otherwise reduce the width of mask structures after a photolithography process. In particular, after a photolithography process has been performed and a patterned mask has been formed on a wafer 102, the non-perpendicular particle bombardment system 108 can be utilized to reduce the width of mask structures, thereby reducing the end-to-end distance between features to be formed in the wafer 102.

In some embodiments, the particle bombardment system outputs particles toward the wafer 102 at a selected angle relative to vertical. The vertical direction is perpendicular to the surface of the wafer 102. Accordingly, the particles travel at a non-vertical angle relative to the surface of the wafer 102. In this sense, the particles travel at a non-perpendicular angle.

The particles bombard or impact the sidewalls of remaining photoresist structures after patterning of the photoresist. The impact of the particles on the sidewalls of the remaining photoresist structures removes a portion of the remaining photoresist structures. This reduces the lateral width of the remaining photoresist structures. This reduction in lateral photoresist dimensions by directional particle bombardment may be termed a directional push. The particles can include atoms, molecules, compounds, ions, or other particles.

In some embodiments, the non-perpendicular particle bombardment system 108 is a particle bombardment system. In this case, the particles are ions. The particle bombardment system outputs a beam of ions toward the wafer 102. The beam of ions impacts the wafer 102 with a trajectory having an angle relative to vertical, i.e. at a non-perpendicular angle. The ions break away material from the sidewalls of the mask structures, thereby reducing the lateral dimensions of the mask structures.

In some embodiments, the non-perpendicular particle bombardment system 108 is a directional plasma etching system. The directional plasma etching system generates a plasma that emits high-energy ions or other charged particles that break apart material on lateral surfaces of the mask structures. The trajectory of the high energy ions or other charged particles can be selected by tilting the wafer relative to normal or by otherwise generating a plasma sheath that emits particles with a selected trajectory.

As used herein, mask features correspond to trenches and apertures formed in the photoresist or other mask layers. Accordingly, the end-to-end separation distance between two features corresponds to the lateral width of the photoresist or other mask layer separating the two features. By reducing the lateral width of the photoresist or other mask layer with the particle bombardment process, the end-to-end separation distance between features is reduced, thereby enabling more complete use of available wafer area.

In one example, the reduction in end-to-end separation distance enables contact vias to be placed closer together. If two features in the mask correspond to two metal lines separated by an initial end-to-end distance, and if the layout design calls for conductive vias to contact each of the metal lines, then the two contacts can be placed closer together if the end-to-end distance between the metal lines is reduced. Accordingly, reducing the end-to-end distance between features can lead to denser formation of other interconnect structures in the wafer 102.

In some embodiments, the particle bombardment system 108 bombards the photoresist structures with particles in multiple steps. In a first particle bombardment step, the particles travel with an angle relative to vertical, have an energy, and a dose level. In a second subsequent particle bombardment step, one or more aspects of the particle beam is changed from the first particle bombardment step. Accordingly, in the second particle bombardment step, one or more of the angle of travel, the energy, or the dose level of the particle beam is changed from the first particle bombardment step. The two particle bombardment steps with different characteristics result in a more effective reduction in width of the remaining photoresist features than if only a single particle bombardment step is performed or if the second particle bombardment step is identical to the first particle bombardment step.

The semiconductor process system 100 includes a layout database 110. The layout database 110 includes a plurality of layouts 112. Each layout 112 indicates the pattern of features to be formed in the wafer 102 at a particular stage of processing. For example, a first layout may indicate the areas of a semiconductor substrate at which N-wells will be formed. A second layout may indicate the areas of the semiconductor substrate at which P-wells will be formed. A third layout 112 may indicate the areas at which the trenches will be etched to define semiconductor fins. Another layout may indicate the areas in which metal lines and conductive vias will be formed in a first interlevel dielectric layer. Another layout may indicate the areas in which metal lines and conductive vias will be formed in a second interlevel dielectric layer. A large number of layouts 112 may be utilized in processing the wafer 102 from start to finish.

In general, one or more photolithography processes may be associated with each layout 112. One or more reticles may be generated for each layout 112. The reticle carries the pattern of the layout 112 or a seed pattern from which the layout is effected after various semiconductor processes have been performed. A photolithography process imparts the pattern of the reticle onto the photoresist on the wafer 102.

One example of a layout 112 is a simulated graphic database system (GDS) layout, though other types or formats of layouts can be used. The layouts 112 may be generated utilizing one or more specialized software programs for generating layouts for semiconductor processing, a photolithography reticle can be generated in accordance with the layout.

The semiconductor process system 100 includes a layout analyzer 114. The layout analyzer 114 is configured to analyze each layout 112. The layout analyzer 114 is configured to select, for each layout 112, whether to utilize the particle bombardment system 108 to reduce the end-to-end distance between the mask features after initial photolithography patterning.

When the layout analyzer 114 analyzes a layout 112, the layout analyzer 114 extracts layout feature data 116 associated with the layout 112. The layout feature data 116 can include data related to the sizes, shapes, and positions of features in the layout 112. The layout analyzer 114 determines whether the particle bombardment system 108 should be utilized after performing a photolithography system associated with the layout 112 based on the layout feature data 116 extracted by the layout analyzer 114 from the layout 112.

The layout feature data 116 can include side-to-side separation distances associated with adjacent features of a layout 112. As described previously, for two adjacent features that both extend in line with each other in a first direction, the end-to-end separation distance corresponds to the distance between adjacent ends of two features in the first direction. Accordingly, the end-to-end separation distance can correspond to the distance between two adjacent ends of two features of the layout 112.

In some embodiments, the layout feature data 116 includes pitch data. The pitch data includes data related to one or more pitches associated with the layout 112. A pitch can correspond to the distance between analogous portions of two adjacent features. For example, if the layout 112 includes two adjacent metal lines, then the pitch associated with the two metal lines can be the distance between an edge of a first metal line and the same edge of a second adjacent metal line.

The layout feature data 116 can include end-to-end and side-to-side separation distances for a large number of adjacent features in a layout. In some cases, the layout feature data 116 can include every side-to-side and end-to-end separation distance associated with the layout 112. In other cases, the layout feature data 116 can include side-to-side and end-to-end separation distances associated with a sampling of features associated with the layout 112. In some cases, the layout feature data 116 can include separation distances associated with features in a selected area of the layout 112. In one example, the layout analyzer 114 extracts the separation distance data associated with a 5 μm by μm 5 portion of a layout 112, though other area values can be utilized without departing from the scope of the present disclosure. The layout feature data 116 can include pitch data for all of the pitches of a layout 112, a sampling of the pitches of a layout 112, or all of the pitches of a selected area of a layout 112.

The feature data 116 can include threshold data for various types of feature measurements. For example, the feature data 116 can include a threshold end-to-end separation distance. The layout feature data 116 can indicate whether each end-to-end separation distance in a layout is less than or greater than the threshold end-to-end separation distance. The feature data 116 can include a threshold side-to-side separation distance and can indicate whether each side-to-side separation distance in a layout 112 is less than, greater than, or equal to the threshold side-to-side separation distance. The feature data 116 may include threshold pitch values and threshold critical dimension values and corresponding data for each pitch in critical dimension in a layout 112.

In some embodiments, the layout feature data 116 includes critical dimension (CD) data. The CD data includes data related to one or more CDs associated with the layout 112. The CD associated with a feature can correspond to the smallest dimension associated with that feature. For example, if the layout 112 includes a metal line with a length of 100 nm and a width of 15 nm, then the CD associated with that metal line can be the 15 nm associated with the width because the width is the smallest lateral dimension of the metal line.

The layout analyzer 114 may include selection rules data 118 and process selection data 120. The selection rules data 118 may include rules or guidelines for determining whether or not the particle bombardment system 108 should be utilized for a particular layout 112. The layout analyzer 114 compares the layout feature data 116 to the selection rules data 118. The layout analyzer 114 determines whether the particle bombardment system should be utilized with the layout based on the comparison of the selection rules data 118 to the layout feature data 116.

In some embodiments, the selection rules data 118 can determine whether the particle bombardment system 108 should be implemented based on whether or not one or more end-to-end separation distances of a layout 112 are greater than a threshold end-to-end separation distance. In this case, if any end-to-end separation distance is greater than a threshold end-to-end separation distance, then the layout analyzer 114 determines that the non-perpendicular particle bombardment system 108 should be utilized in association with that layout. Otherwise, the photolithography system 106 can be utilized without the particle bombardment system 108.

In one example, the threshold end-to-end separation distance is 30 nm. This threshold end-to-end separation distance may be useful in situations in which a photolithography system 106 is unable, by itself, to produce end-to-end separation distances less than 30 nm. Other threshold end-to-end separation distances may be utilized without departing from the scope of the present disclosure.

In some embodiments, the selection rules data 118 can determine whether the particle bombardment system 108 should be implemented based on whether or not one or more side-to-side separation distances of a layout 112 are greater than a threshold side-to-side separation distance. In this case, if any side-to-side separation distance is smaller than a threshold side-to-side separation distance, then the layout analyzer 114 determines that the EUV photolithography system 106 should be utilized for the photolithography process associated with that layout. Otherwise, the photolithography system 106 can be utilized without the particle bombardment system 108.

In one example, the threshold side-to-side separation distance is 15 nm. This threshold side-to-side separation distance may be useful in situations in which a photolithography system 106 is unable, by itself, to produce side-to-side separation distances less than 15 nm. Other threshold side-to-side separation distances may be utilized without departing from the scope of the present disclosure.

In some embodiments, the selection rules data 118 can determine whether the particle bombardment system 108 should be implemented based on whether or not the percentage of end-to-end separation distances that are smaller than the threshold end-to-end separation distance is less than a threshold percentage. For example, the threshold percentage may be between 45% and 55%. If the percentage of end-to-end separation distances that are smaller than the threshold end-to-end separation distance is less than the threshold percentage, then the layout analyzer 114 can select the use the particle bombardment system 108 after the photolithography process.

In some embodiments, the selection rules data 118 can include rules related to both end-to-end separation distances and side-to-side separation distances. The selection rules data 118 can indicate that if one or more side-to-side separation distances is smaller than a threshold side-to-side separation distance and if one or more end-to-end separation distances is larger than a threshold end-to-end separation distance, then the layout analyzer 114 should select to utilize the particle bombardment system 108 after a photolithography process associated with the layout.

In some embodiments, the selection rules data 118 can include multiple rules related to end-to-end separation distances, side-to-side separation distances, pitches, CDs, and other characteristics. The selection rules data 118 may indicate that the layout analyzer 114 should select to use the particle bombardment system 108 based on compliance or violation of various of the selection rules.

In some embodiments, the layout analyzer 114 generates a layout score based on the layout feature data 116 and the selection rules data 118. The score can be based on the number of selection rules data that are satisfied (or violated) by the layout feature data 116. Selection of the particle bombardment system 108 can be based on the layout score. For example, the layout score associated with a layout can be compared to a threshold layout score and either the particle bombardment system 108 can be selected based on the comparison of the layout score to the threshold layout score.

The semiconductor process system 100 may also include a layout adjustment system 122. The layout adjustment system can adjust layouts 112 after the layout analyzer 114 determines that a non-perpendicular particle bombardment process should be utilized. In one example, the non-perpendicular particle bombardment process may result in the ability to place conductive vias closer together in a layout due to the shrinking end-to-end separation distance that results from use of the particle bombardment process. The layout that defines placement of those conductive vias may need to be adjusted. Furthermore, the layouts 112 of features above and below the conductive vias in a wafer may also need to be adjusted to account for the new placement of the conductive vias. Accordingly, the layout adjustment system 122 can automatically adjust layouts for compatibility after selection of the non-perpendicular particle bombardment system 108 results in changes to some feature placements.

The semiconductor process system 100 includes semiconductor process equipment 104. Typically, semiconductor wafers 102 undergo a large number of processes during fabrication. These processes can include thin-film depositions, etching processes, dopant implantation processes, annealing processes, epitaxial growth processes, chemical mechanical planarization (CMP) processes, and other types of processes. The semiconductor process equipment 104 includes tools and other equipment to perform semiconductor processes on the wafers. In practice, the photolithography system 106 and the non-perpendicular particle bombardment system 108 may be part of the semiconductor process equipment 104.

Figure 2B:
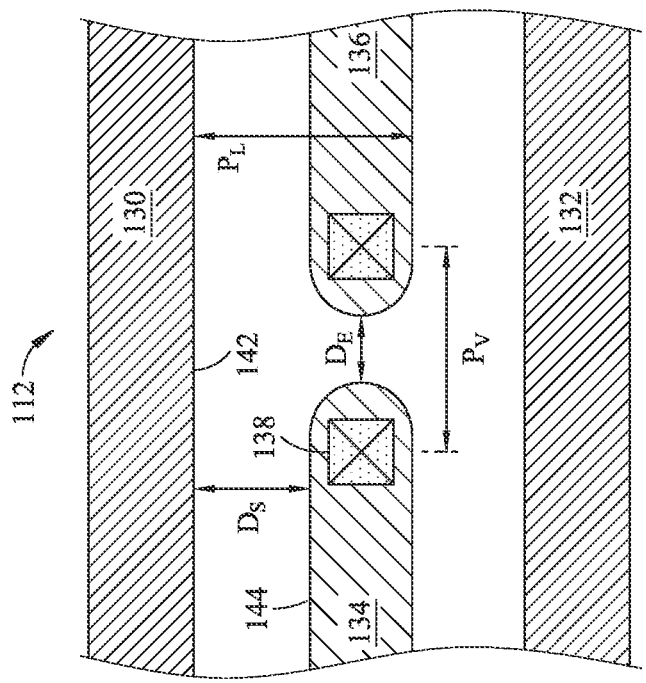
FIGS. 2A and 2B are top views of layouts, in accordance with some embodiments.
Figure 2A:
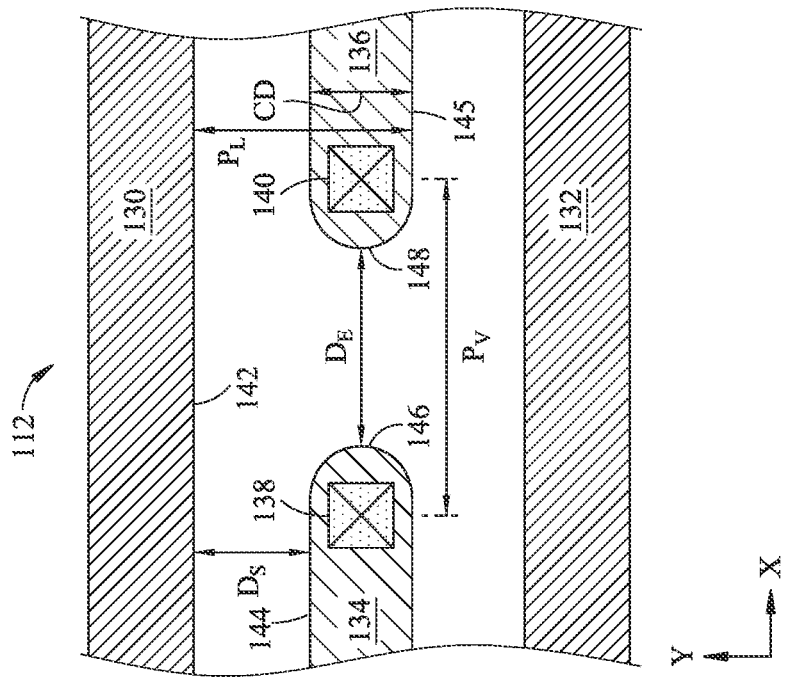

FIG. 2A illustrates a layout 112, in accordance with some embodiments. The layout 112 corresponds to a top view of a desired pattern of features to be implemented in a wafer 102 at a particular stage of processing. In the example of FIG. 2A, the layout 112 corresponds to a top view of metal lines to be formed in a substrate, such as an interlevel dielectric layer. The layout 112 is not an actual wafer, only the pattern of features to be implemented in a wafer. Accordingly, the layout 112 is a visual representation of a layout plan stored in the layout database 110 as described in relation to FIG. 1.

The layout 112 includes metal lines 130, 132, 134, and 136. The metal line 130 extends unbroken in the view of FIG. 2A along the X direction. The metal line 132 also extends unbroken in the view of FIG. 2A along the X direction. The metal line 134 is positioned between the metal lines 130 and 132 and extends along the X direction. The metal line 136 is positioned between the metal lines 130 and 132 and extends along the X direction. The metal lines 134 and 136 are aligned with each other along the X direction.

The metal line 130 has an edge 142 that is closest to the metal lines 134 and 136. The metal line 134 has an edge 144 that is closest to the edge 142 of the metal line 130. The metal line 136 has an edge 145 that is furthest from the edge 142 of the metal line 130. The metal line 134 has an end 146. The metal line 136 has an end 148.

The metal line 134 is separated from the metal line 130 by a side-to-side (or edge-to-edge) separation distance $D_S$. The separation distance $D_S$ corresponds to the lateral distance along a Y direction between the edge 144 of the metal line 134 and the edge 142 of the metal line 130. Though not explicitly detailed, the metal line 136 is also separated from the metal line 130 by the same separation distance $D_S$.

The metal line 134 is separated from the metal line 136 by an end-to-end separation distance $D_E$. The end-to-end separation distance $D_E$ corresponds to the distance between the end 146 of the metal line 134 and the end 148 of the metal line 136. As the end 148 and 146 of the metal lines 136 and 134 are rounded, the separation distance $D_E$ corresponds to the distance between the closest points of the ends 146 and 148.

The metal line 136 and the metal line 130 defines a metal line pitch $P_L$. The pitch $P_L$ corresponds to the distance between the edge 142 of the metal line 130 and the edge 145 of the metal line 136. Though not detailed in FIG. 2A, the pitch between the metal line 130 and the metal line 134 is the same as the pitch $P_L$.

The metal line 136 has a critical dimensions CD. The critical dimensions CD corresponds to the smallest dimension of the metal line 136. In this example, the CD corresponds to the width of the metal line 136 in the Y direction.

The layout 112 of FIG. 2A defines the positions of conductive vias 138 and 140. The conductive via 138 contacts the metal line 134 near the end 146 of the metal line 134. The conductive via 140 contacts the metal line 136 near the end 148 of the metal line 136. The conductive vias 138 and 140 may correspond to conductive vias that extend from a higher level to contact the metal lines 134 and 136. Alternatively, the conductive vias 138 and 140 may correspond to conductive vias that extend downward from the metal lines 134 and 136 to conductive structures further below. The conductive vias are separated by a pitch $P_V$. The pitch $P_V$ may correspond to the distance from the center of the conductive via 138 to the center of the conductive via 140.

The layout 112 corresponds to a layout in which the metal lines 130, 132, 134, and 136 are patterned with a photolithography process but without a non-perpendicular particle bombardment process. As such, the end-to-end separation distance $D_E$ is larger than the side-to-side separation distance $D_S$. This may result from limitations of the photolithography system 106 or from other factors.

In one example, the side-to-side distance $D_S$ is between 10 nm and 20 nm. The end-to-end separation distance $D_E$ is between 25 nm and 35 nm. The via pitch $P_V$ is between 35 and 45 nm. The line pitch $P_L$ is between 25 nm and 35 nm. The CD is between 10 nm and 15 nm. Distances other than these can be utilized for the layout 112 without departing from the scope of the present disclosure.

In some embodiments, the layout analyzer 114 can analyze the layout 112 and can extract layout feature data 116. The layout feature data includes the side-to-side separation distances $D_S$, the end-to-end separation distances $D_E$, the via pitch $P_V$, line pitch $P_L$, and the CDs of each of the metal lines 130, 132, 134, and 136. The layout analyzer 114 compares the layout feature data 116 to selection rules data 118. The selection rules data may indicate that if there are end-to-end distances greater than a threshold distance, for example 30 nm, then the particle bombardment system 108 should be utilized to reduce the end-to-end separation distances $D_E$. Other separation rules, or sets of separation rules can be utilized by the layout analyzer 114 in determining whether or not the particle bombardment system 108 should be utilized in association with the layout 112.

In the example of FIG. 2A, the layout analyzer 114 determines that the particle bombardment system 108 should be utilized to reduce the end-to-end separation distance $D_E$. After the layout analyzer 114 determines that the particle bombardment system 108 should be utilized to reduce the end-to-end separation distance $D_E$, the layout adjustment system 122 adjusts the layout 112. The adjusted layout 112 is shown in FIG. 2B.

FIG. 2B is a visual representation layout 112 of FIG. 2A after being adjusted by the layout adjustment system 122 in accordance with the selection by the layout analyzer 114 to utilize the particle bombardment system 108. Though not shown in FIG. 2B, the layout adjustment system 122 may adjust the layouts of other layers below and above the layout 112 of FIG. 2B responsive to adjusting the layout 112.

In FIG. 2B, the layout 112 takes into account the particle bombardment process that will be performed by the particle bombardment system 108. The particle bombardment process has the effect of pushing the end 146 of the metal line 134 toward the end 148 of the metal line 136 and of pushing the end 148 of the metal line 136 toward the end 146 of the metal line 134. The result is that the end-to-end separation distance $D_E$ is greatly reduced. Furthermore, the via pitch $P_V$ is also greatly reduced. The result is that the area of the wafer 102 is more efficiently utilized. Details of the particle bombardment process are set forth in further below.

In an example in which the separation distance $D_E$ was between 25 and 35 nm in FIG. 2A, the separation distance $D_E$ in FIG. 2B may now be between 10 and 15 nm. The via pitch $P_V$, which may have been between 35 nm and 45 nm is now between 20 and 25 nm. Other distances and changes in distance can be utilized without departing from the scope of the present disclosure. Dimensions in the Y direction are not changed by the particle bombardment process in the example of FIGS. 2A and 2B. However, in practice, a particle bombardment process may be performed to reduce separation distances in the Y direction as well.

FIG. 3A is a cross-sectional view of a wafer 102 at an intermediate stage of processing, according to one embodiment. The wafer 102 includes a substrate 150 and a layer of photoresist 152 on the substrate 150. The substrate 150 can include a dielectric layer, a conductive layer, a semiconductor layer, or other type of material. In one example, the substrate 150 is an interlevel dielectric layer such as silicon oxide, silicon nitride, or other suitable dielectric materials.

In FIG. 3B, a photolithography process has been performed. The photoresist 152 has been irradiated by the photolithography light via a reticle that carries a pattern in accordance with a layout 112. After irradiation by the photolithography light, the portions of the photoresist 152 that were not radiated are removed.

The photoresist 152 are remnants of a photoresist layer that has been patterned with an initial patterning process. The initial patterning process can include standard photolithography patterning such as exposure to ultraviolet light to a mask, and removal of exposed or unexposed photoresist. The patterning forms trenches 154 in the photoresist 152. The photoresist structure 152 remaining in FIG. 3B has a sidewall 156, a sidewall 158, and a top surface 160.

The trenches 154 are separated by an end-to-end separation distance $D_E$. The end-to-end separation distance corresponds to the width of the photoresist 152 at the narrowest point between the trenches 154.

FIG. 3C is a top view of the wafer 102 at the stage of processing of FIG. 3B. FIG. 3C also illustrates the cut line B along which the cross-section of FIG. 3B is taken. The top view of FIG. 3C illustrates four trenches 154 formed in the photoresist 152. FIG. 3C also illustrates how the ends of the trenches 154 are rounded. This is a result of photolithography processes that often produce rounded ends in the features formed in photoresist. These rounded ends are typically transferred to features formed based on the pattern of the photoresist 152.

FIG. 3D is a cross-sectional view of the wafer 102 during a particle bombardment process, in accordance with some embodiments. The particle bombardment process can be performed by the non-perpendicular particle bombardment system 108 of FIG. 1. FIG. 3D illustrates a particle bombardment step of the sidewall 156 of the photoresist 152. Particles 162 are emitted from an ion source of the particle bombardment system 108. The particles 162 travel at an angle θ with respect to vertical. The particle bombardment process can be considered a non-perpendicular particle bombardment process.

In some embodiments, the angle θ is between 35° and 65° relative to vertical. Other angles for θ can be utilized without departing from the scope of the present disclosure. The particles 162 can have an energy between 0.5 keV and 8.0 keV. The particle bombardment process can have a dose of between 1E15 and 1E16 particles. The particles 162 can include ions. In one example, the ions are argon ions. Other angles, energies, doses, and types of particles can be utilized without departing from the scope of the present disclosure.

FIG. 3D illustrates the wafer 102 after the particle bombardment step of the sidewall 156 of the photoresist 152. As can be seen with comparison to FIG. 3B, photoresist material has been removed from the sidewall 156 of the photoresist 152 and from the top surface 160 of the photoresist 152. The removal is the result of the bombardment by the particles 162.

FIG. 3E is a cross-sectional view of the wafer 102 during a particle bombardment process of the side wall 158 of the photoresist 152, in accordance with some embodiments. The particle bombardment process of the side wall 158 can have the same angle, energy, dose, and ion species as the particle bombardment process of the side wall 156. For clarity, FIG. 3E illustrates the trajectory of the particles 162 as coming from a different direction than in FIG. 3D. However, in practice, the wafer 102 is rotated 180° in the XY plane between FIG. 3D and FIG. 3E. The rotation of the wafer 102 allows the particle source to bombard the side wall 158 of the photoresist 152 without moving the particle source.

After the particle bombardment processes of FIGS. 3D and 3E, the photoresist 152 is narrower between the trenches 154. This corresponds to a smaller end-to-end separation distance $D_E$ than in FIG. 3B. The thickness of the photoresist 152 is reduced after the particle bombardment processes of FIGS. 3D and 3E. In some examples, the particle bombardment process may reduce the end-to-end separation distance by between 15 and 20 nm, though other changes in separation distance are possible without departing from the scope of the present disclosure.

FIG. 3F is a top view of the wafer 102 at the stage of processing shown in FIG. 3E. The top view of FIG. 3F illustrates that the end-to-end separation distance $D_E$ of the trenches 154 has been significantly reduced with respect to FIG. 3C. Furthermore, the dimensions of the trenches 154 in the Y direction have not been significantly altered. The ends of the trenches 154 have retained the rounded shape after the particle bombardment process.

In FIG. 3G, and etching process has been performed. The etching process etches the substrate 150 in the pattern of the photoresist 152. In particular, the trenches 154 in the photoresist 152 are extending downward into the substrate 150. The etching process is an anisotropic etching process that etches in the downward direction. The etching process can include a wet etch, a dry etch, or other types of etches. The effect of the etching process of FIG. 3G is to transfer the pattern of the photoresist 152 to the substrate 150.

In FIG. 3H, the conductive material has been deposited in the trenches 154. After deposition of the conductive material, a planarization process is performed that removes the conductive material and the remaining portions of the photoresist 152 from outside of the trenches 154. The result is that the conductive material remains only in the trenches 154 and in the substrate 150. The conductive material can include tungsten, aluminum, titanium, copper, gold, tantalum, or other conductive materials. The deposition process can include ALD, PVD, CVD, or other suitable deposition processes.

The deposition of the conductive material results in metal lines 134 and 136 being formed in the trenches 154. The layout of metal lines in the wafer 102 corresponds to the layout 112 of FIG. 2B. This can be more readily seen in the top view of FIG. 3I.

Figure 3I:
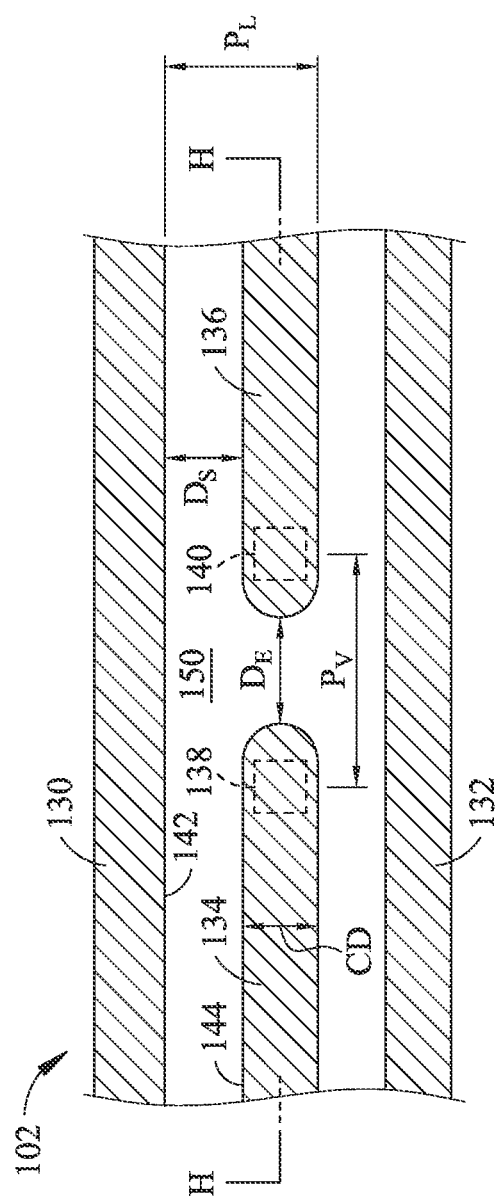

FIG. 3I is a top view of the wafer 102 at the stage of processing of FIG. 3H. The top view of FIG. 3I illustrates that metal lines 130, 132, 134, and 136 have been formed by deposition of the conductive material in the trenches 154 and the substrate 150. Though not apparent in FIG. 3I, the end-to-end separation distance $D_E$ may be less than or equal to the side-to-side separation distance $D_S$. The layout of FIG. 2B has been implemented by utilizing a non-perpendicular particle bombardment process after the initial photolithography process. The reduction in the end-to-end separation distance $D_E$ can be accomplished without the use of an extra mask. Thus, inclusion of the particle bombardment process is inexpensive in terms of processing time and resources because an extra photolithography process is not utilized. FIG. 3I also illustrates the positions at which conductive vias 138 and 140 will contact the metal lines 134 and 136 from above.

In one example, the side-to-side distance $D_S$ is between 10 nm and 20 nm. The end-to-end separation distance $D_E$ is between 10 nm and 20 nm. The via pitch $P_V$ is between 15 nm and 25 nm. The line pitch $P_L$ is between 25 nm and 35 nm. The CD is between 10 nm and 15 nm. Distances other than these can be utilized for the layout 112 without departing from the scope of the present disclosure.

Figure 4:
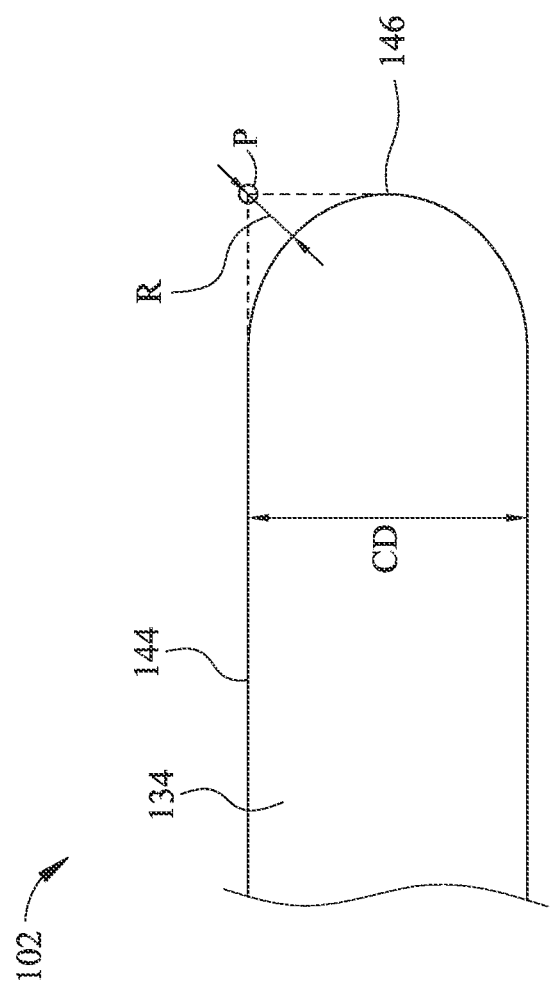
FIG. 4 is a top view of a metal line in a wafer, in accordance with some embodiments.

FIG. 4 is an enlarged top view of a metal line 134 of a wafer 102, in accordance with some embodiments. The view of FIG. 4 corresponds to the metal line 134 after both a photolithography process and a particle bombardment process has been performed. The end of the metal line 134 retains a rounded shape after the particle bombardment process has been performed. Stated another way, after the particle bombardment process of a mask layer, the trench in the mask layer retains the rounded end. The corresponding trench is etched in a substrate below the mask. The metal line 134 is then formed in the trench in the substrate. The trench in the substrate has the rounded end of the mask layer after the particle bombardment process of the mask layer. The metal line 134 also has the rounded end.

In some embodiments, a metal line 134 formed in accordance with the particle bombardment process resulted a minimum distance R between the rounded edge of the metal line 134 and a hypothetical point P greater than or equal to the CD of the metal line 134 divided by four. Accordingly, the distance R can be given by the following relationship:

$$R \geq CD/4$$

The point P corresponds to the point at which a vertical line drawn from the end 146 meets a horizontal line continuing from the edge 144 of the metal line 134. R can have other characteristics or relationships without departing from the scope of the present disclosure.

In instances in which the end-to-end distance $D_E$ is less than or equal to the side-to-side separation distance $D_S$, a metal line 134 may have a distance R given by the relationship above. This may be distinct from other processes for forming end-to-end distances the less than or equal to $D_S$. For example, another process that can be used to form end-to-end distances $D_E$ less than or equal to $D_S$ is to perform two photolithography processes. After the first photolithography process, the metal lines 134 and 136 would be a single continuous metal line. A second photolithography process is then utilized to etch a break that electrically separates the metal line 134 and 136. However, in this case the ends of the metal lines 134 and 136 will not be rounded but will be rectangular. While this can produce small end-to-end separation distances $D_E$, it is much more cost-effective to perform a single photolithography process coupled with a particle bombardment process as described above than to perform two photolithography processes. This is due to the extra time and costs associated with photolithography processes, as well as the possibility of overlay/alignment errors associated with the second mask.

As photolithography processes may only be able to achieve end-to-end separation distances of 30 nm, it is beneficial to use a non-perpendicular bombardment process to reduce end-to-end separations to around 15 nm or less. Furthermore, the non-perpendicular particle bombardment process can produce end-to-end separations that are less than or equal to side to side separation distances.

Figure 5A:
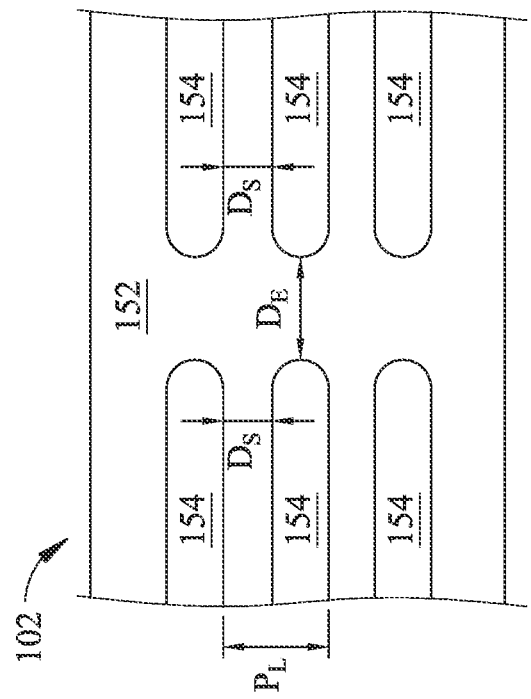
FIGS. 5A and 5B are top views of a wafer, in accordance with some embodiments.

FIG. 5A is a top view of a wafer 102 after an initial photolithography process, in accordance with some embodiments. The photolithography process includes patterning trenches 154 in a layer of photoresist 152. Alternatively, the top view of the wafer 102 can include trenches 154 formed in a different mask layer than photoresist 152, or in a layer of photoresist 152 and in a substrate 150. The trenches have an end-to-end separation distance $D_E$, a side-to-side separation distance $D_S$ and a line pitch $P_L$. In one example, the side-to-side separation distance $D_S$ is about 15 nm, the end-to-end separation distance $D_E$ is about 30 nm, and the line pitch is about 30 nm. Other dimensions can be utilized for the layout showing FIG. 5A without departing from the scope of the present disclosure.

Figure 5B:
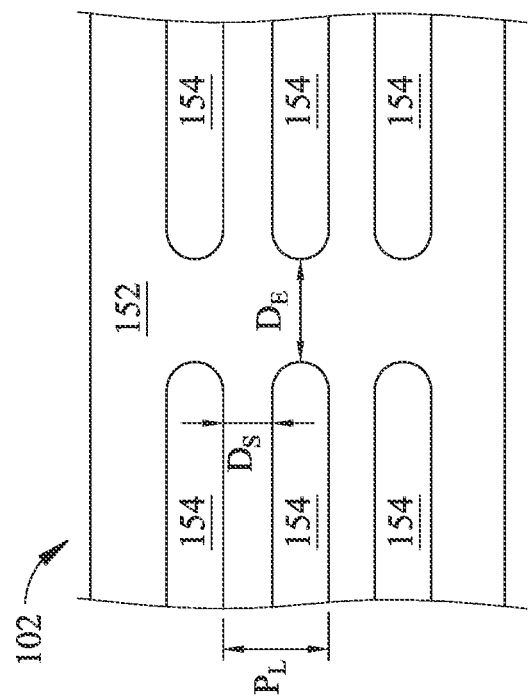

FIG. 5B is a top view of the wafer 102 of FIG. 5A after a particle bombardment process has been performed. The particle bombardment process has the effect of reducing the end-to-end separation distance $D_E$ between trenches 154. The side-to-side separation distance $D_S$ and the line pitch $P_L$ are substantially unchanged. The particle bombardment process has the effect of causing the end-to-end separation distance $D_E$ data value less than or equal to the side-to-side separation distance $D_S$. Alternatively, the end-to-end separation distance $D_E$ may still be slightly larger than the side-to-side separation distance $D_S$.

In one example, after the particle bombardment process the end-to-end separation distance $D_E$ is about 14 nm, the side-to-side separation distance $D_S$ is about 14 nm, and the line pitch $P_L$ is about 30 nm. Other dimensions can be accomplished with the particle bombardment process without departing from the scope of the present disclosure.

Figure 6A:
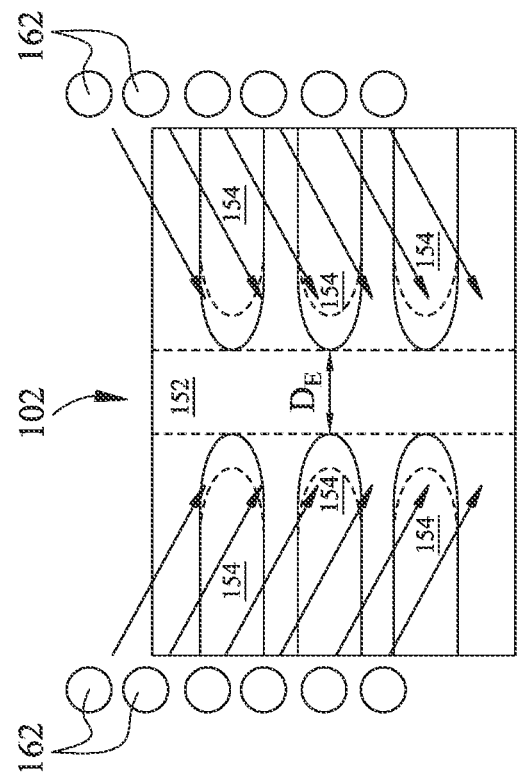
FIGS. 6A and 6B are top views of a wafer, in accordance with some embodiments.
Figure 6B:
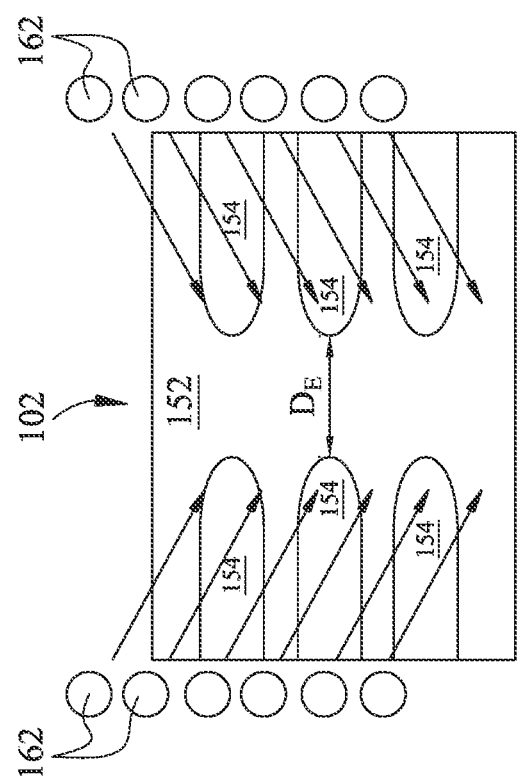

FIGS. 6A and 6B illustrate the use of multiple particle bombardment processes, in accordance with some embodiments. In FIG. 6A, an initial photolithography process is illustrated, in accordance with some embodiments. The photolithography process includes patterning trenches 154 in a layer of photoresist 152. In FIG. 6A a first particle bombardment process is performed. During the first particle bombardment process, the wafer 102 is bombarded with particles having a first energy, a first angle relative to vertical, and a first dose or elapsed time. The ion characteristics of the first particle bombardment process may be selected so that little or no change is effected in the end-to-end separation distance $D_E$. The characteristics of the first particle bombardment process may be selected to prepare the photoresist 152 for a second particle bombardment process.

In FIG. 6B a second step of the particle bombardment process is performed. During the second step of the particle bombardment process, the wafer 102 is bombarded with particles having a second energy, a second angle relative to vertical, and a second dose or elapsed time. The ion characteristics of the second particle bombardment step may be selected so to significantly reduce the end-to-end separation distance $D_E$. During the second particle bombardment step, one or more of the second energy, the second angle, and the second dose or elapsed time are different than the first energy, the first angle, and the first dose or elapsed time. The results of the combination of the first and second particle bombardment processes is that the end-to-end separation distance $D_E$ is greatly reduced with respect to the end-to-end separation distance $D_E$ prior to the first and second particle bombardment processes.

The particle bombardment system 108 bombards the wafer 102 with particles in multiple steps. In a first particle bombardment step, the particles travel with an angle relative to vertical, have an energy, and a dose level. In a second subsequent particle bombardment step, one or more aspects of the ion beam is changed from the first particle bombardment step. Accordingly, in the second particle bombardment step, one or more of the angle of travel, the energy, or the dose level of the ion beam is changed from the first particle bombardment step. The two particle bombardment steps with different characteristics result in a more effective reduction in width of the remaining photoresist features than if only a single particle bombardment step is performed or if the second particle bombardment step was identical to the first particle bombardment step.

In one example, in the first particle bombardment step the particles are output toward the wafer 102 with a first angle relative to vertical. In the second subsequent particle bombardment step, the particles are output toward the wafer 102 with a second angle different than the first angle. This combination of different particle bombardment angles reduces the effects of shadowing and results in effective removal of photoresist. Shadowing can reduce the effectiveness of the particle bombardment processes.

In one example, in the first particle bombardment step the particles are output toward the wafer 102 with a first energy. In the second subsequent particle bombardment step, the particles are output toward the wafer 102 with a second energy different than the first energy. This combination of different particle bombardment energies reduces hardening and results in effective photoresist removal. The energy of an ion corresponds to its kinetic energy. For two particles of the same mass, the ion with more energy will have a higher velocity than the ion with less energy.

In one example, in the first particle bombardment step a first dose of particles are output from the particle bombardment system to the wafer 102. In the second subsequent particle bombardment step, a second dose of particles different than the first dose are output from the particle bombardment system to the wafer 102. As used herein, a dose corresponds to the number of particles that bombard the wafer 102 in a given particle bombardment step. A higher particle bombardment dose corresponds to a greater number of particles bombarding the wafer 102. If the number of particles per second is constant for two particle bombardment steps, then a higher dose can correspond to bombarding the wafer 102 for a longer period of time.

In practice, the two particle bombardment steps will be performed for each side of a photoresist structure. If a photoresist structure is considered as a vertical wall having two vertical sides and a top surface, then in one embodiment the two particle bombardment steps will be performed first on one vertical side and then on the other vertical side. Accordingly, after the two particle bombardment steps have been performed on the first vertical side, then the two particle bombardment steps will be performed on the second vertical side. To accomplish this, the wafer 102 is rotated 180° in the X-Y plane after the first two particle bombardment steps. The second two particle bombardment steps are then performed after the rotation.

In one embodiment, the first particle bombardment step is first performed on a first vertical side of a photoresist structure. The wafer is then rotated 180° in the X-Y plane and the first particle bombardment step is then performed on the second vertical side of the photoresist structure. The second particle bombardment step is then performed on the second vertical side of the photoresist structure. The wafer is then rotated 180° in the X-Y plane and the second particle bombardment step is performed on the first vertical side of the photoresist structure.

Figure 7B:
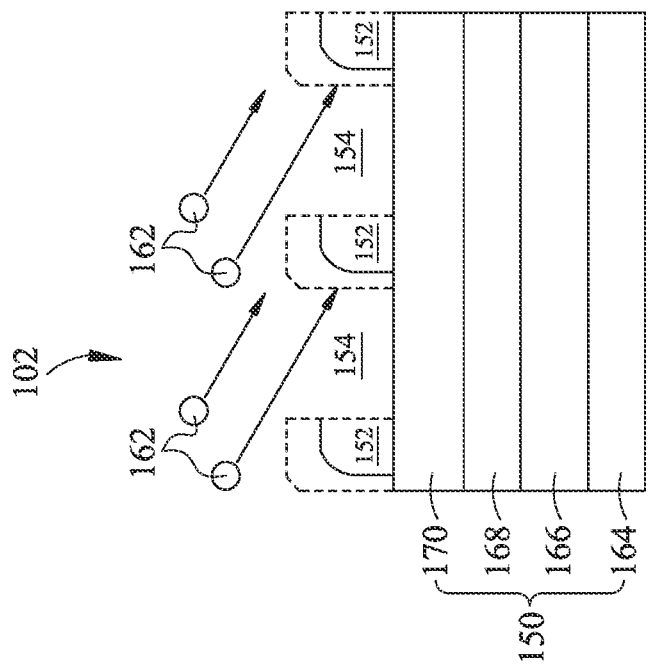
FIGS. 7A and 7B are cross-sectional views of a wafer, in accordance with some embodiments.
Figure 7A:
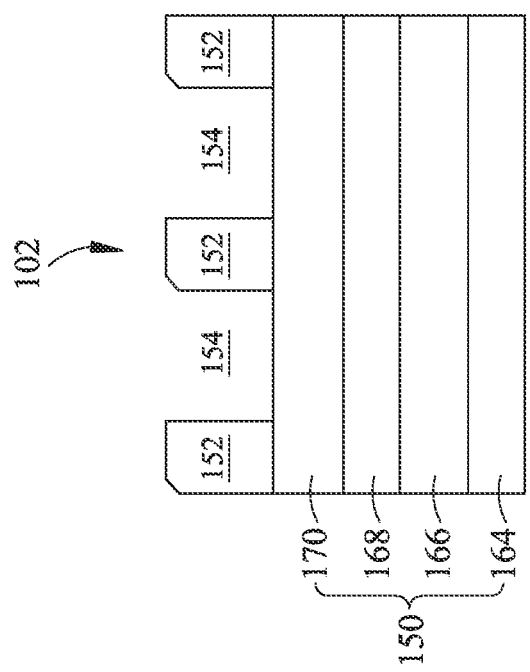

FIG. 7A is a cross-sectional view of a wafer 102 at an intermediate stage of processing, in accordance with some embodiments. In FIG. 7A, a layer of photoresist 152 has been patterned to form a mask in a first photolithography process. The patterning process forms a plurality of trenches 154 in the photoresist 152. The mask is formed on a substrate 150. The substrate 150 may include a plurality of layers.

In FIG. 7A, the substrate 150 includes a first layer 164, a second layer 166, a third layer 168, and the fourth layer 170. In one example, the layer 164 includes tetraethoxysilane (TEOS), the layer 166 includes titanium nitride, the layer 168 includes TEOS, and the layer 170 includes an organic polymer material or another type of dielectric layer. Other materials, and numbers of layers, and combinations of layers can be utilized for the substrate 150 without departing from the scope of the present disclosure.

In FIG. 7B, a particle bombardment process is performed. The particle bombardment process removes material from the photoresist structures 152 separating the trenches 154. The particle bombardment process has the effect of reducing the lateral width of the photoresist structures 152. In some embodiments, the particle bombardment process is performed only on one side of the photoresist structures 152. The particle bombardment process on a single side of the photoresist structures 152 may result in a sufficient reduction in width of photoresist structures 152 such that a particle bombardment process on the other side of the photoresist structures 152 is not utilized. Alternatively, the particle bombardment process may be performed on both sides of the photoresist structures 152.

FIG. 8A is an isometric view of a wafer 102 after an initial photolithography process, in accordance with some embodiments. The photolithography process includes patterning trenches 154 in a layer of photoresist 152. The photoresist 152 is positioned on a substrate 150. The substrate 150 can include silicon oxide or another material. Alternatively, the wafer 102 can include trenches 154 formed in a different mask layer than photoresist 152, or in a layer of photoresist 152 and in a substrate 150. The substrate 150 can correspond to a hard mask layer.

In FIG. 8B, a particle bombardment process is performed. Particles 162 bombard the photoresist 152 at the non-perpendicular angle, as described previously. FIG. 8C is a view of the wafer 102 after the particle bombardment process has been performed. The particle bombardment process has removed photoresist material and has widened the trenches 154. The trenches 154 have maintained the rounded ends after the particle bombardment process.

Figure 9:
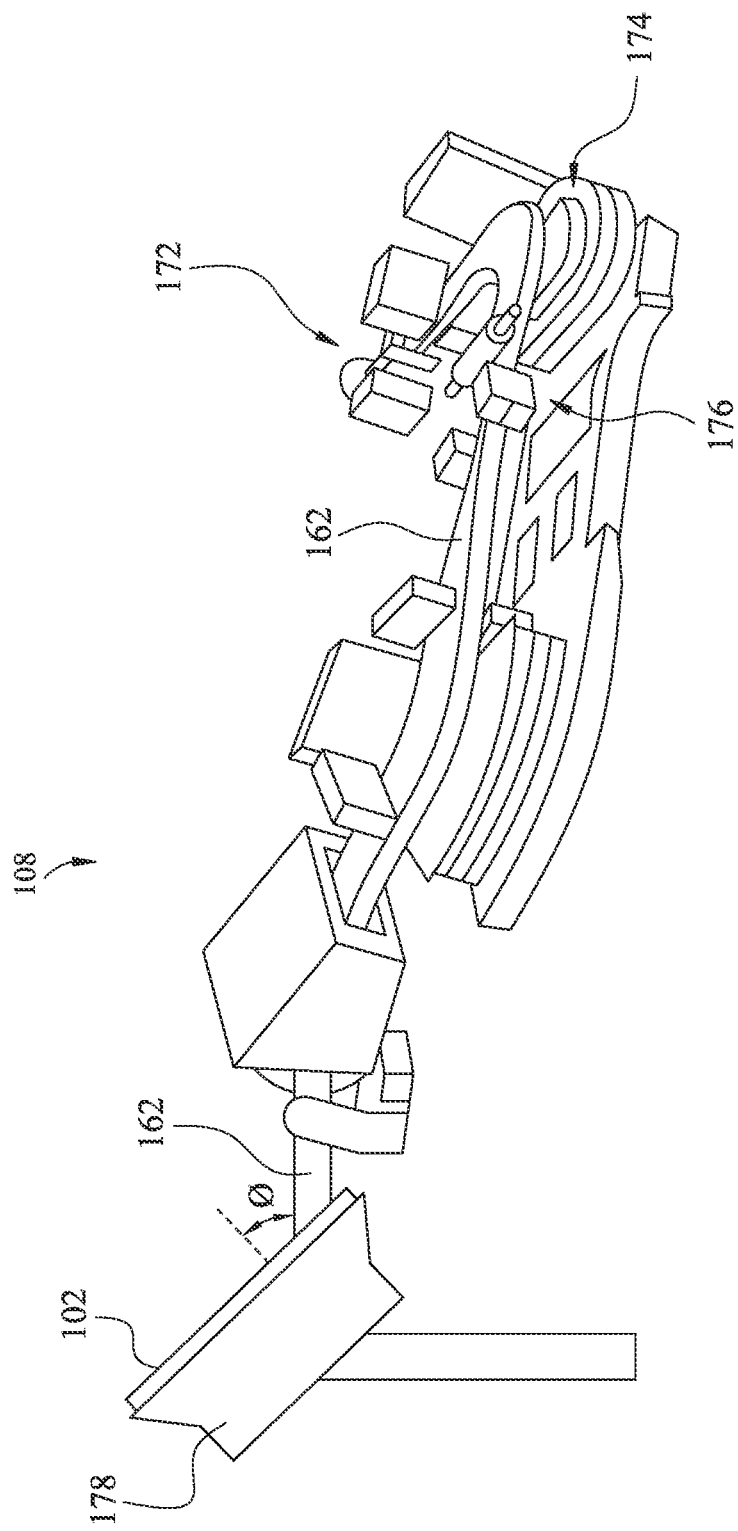
FIG. 9 is an illustration of a non-perpendicular particle bombardment system, in accordance with some embodiments.

FIG. 9 is an illustration of a particle bombardment system 108, in accordance with some embodiments. The particle bombardment system 108 is an ion bombardment system. The ion bombardment system can correspond to a similar system as an ion implantation system. The ion bombardment system is one example of a particle bombardment system 108 that can be utilized with respect to processes, systems, and components described in relation to FIGS. 1-8B. The particle bombardment system 108 includes an ion source 172. The ion source emits a stream of particles 162. In one example, the ions are argon ions, though other types of particles can be utilized without departing from the scope of the present disclosure.

The system 108 includes an ion selection magnet 174. The ion selection magnet alters the trajectory of the particles 162 by establishing a magnetic field. Because the particles 162 carry a net electric charge, the trajectory of the particles 162 is altered when the particles 162 pass through the magnetic field. Particles with a particular charge to mass ratio will be successfully directed by the ion selection magnet to an ion selection aperture 176. Particles that do not carry a net charge will not be redirected by the ion selection magnet 174. Particles that do not carry a selected charge to mass ratio will not be directed into the ion selection aperture 176. The particle bombardment system 108 can include a various apertures, filters, and devices to direct a ribbon beam of particles 162 onto the wafer 102.

The system 108 includes a wafer support 178. The wafer support 178 is configured to hold the wafer 102. The wafer support 178 can also tilt, translate, and rotate. The tilt angle of the wafer support 178 defines the particle bombardment angle θ. In other words, adjusting the tilt angle of the wafer support 178 corresponds to adjusting the particle bombardment angle θ. Translation of the wafer support 178 corresponds to moving the wafer support 178 up or down or left to right. The translation of the wafer support 178 enables different parts of the wafer 102 to be bombarded with particles. Rotation of the wafer support 178 enables bombardment of opposite sides of photoresist structures. For example, with reference to FIGS. 3D and 3E, in FIG. 3D the particles bombard the first sidewall 156 of the photoresist 152. In FIG. 3E, the wafer support 178 has rotated the wafer 180° so that the particles bombard the second sidewall 158 of the photoresist 152. Other configurations of a particle bombardment system 108 can be utilized without departing from the scope of the present disclosure.

Figure 10:
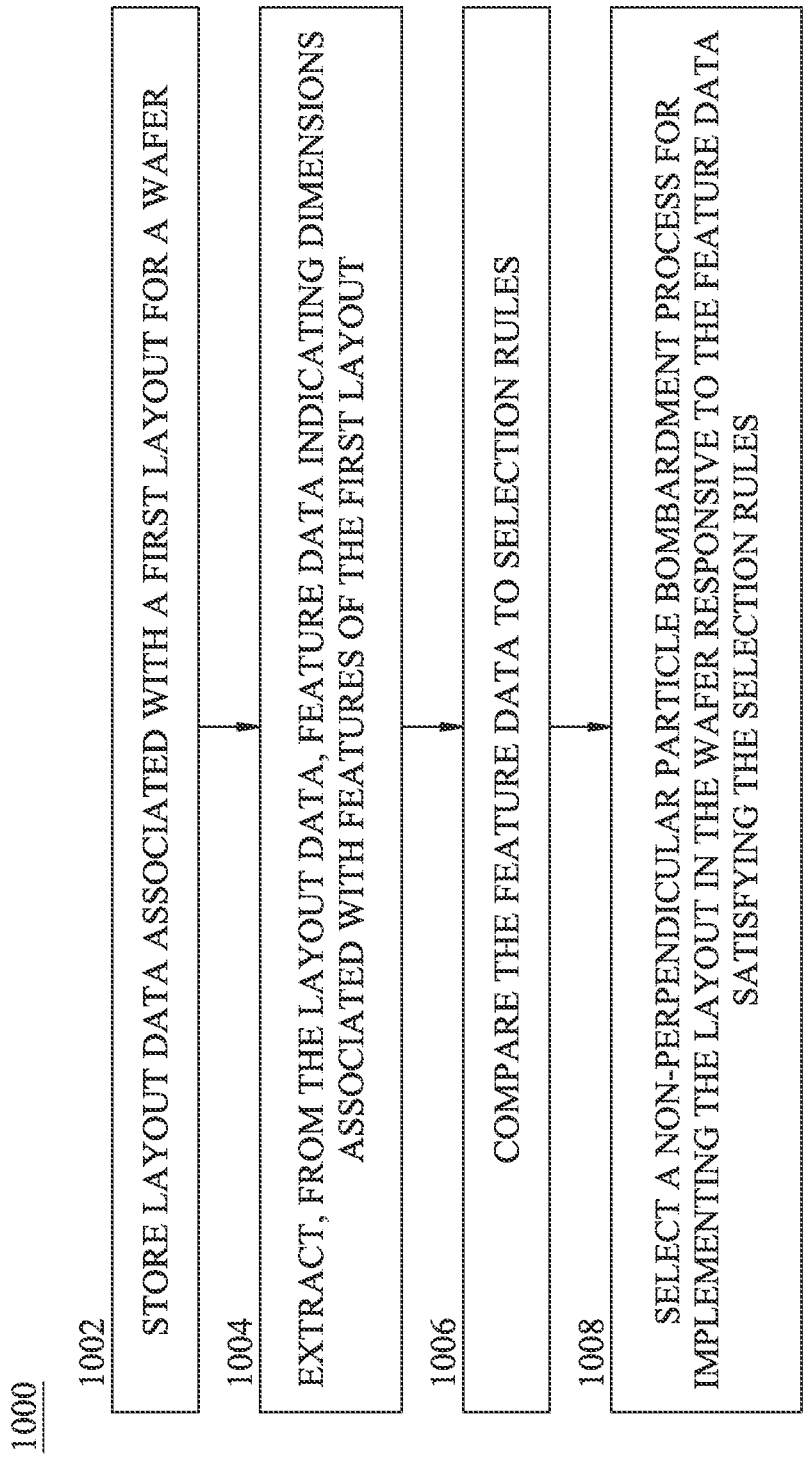
FIG. 10 is a flow diagram of a method for operating a semiconductor processing system, in accordance with some embodiments.

FIG. 10 is a flow diagram of a method 1000, in accordance with some embodiments. The method 1000 can utilize systems, processes, and structures described in relation to FIGS. 1-9. At 1002, the method 1000 includes storing layout data associated with a first layout for a wafer. One example of layout data is the layout data 110 of FIG. 1. One example of a wafer is the wafer 102 of FIG. 1. At 1004, the method 1000 includes extracting, from the layout data, feature data indicating dimensions associated with features of the first layout. One example of feature data is the feature data 116 of FIG. 1. At 1006, the method 1000 includes comparing the feature data to selection rules. One example of selection rules is the selection rules data 118 of FIG. 1. At 1008, the method 1000 includes selecting a non-perpendicular particle bombardment process for implementing the layout in the wafer responsive to the feature data satisfying the selection rules.

Figure 11:
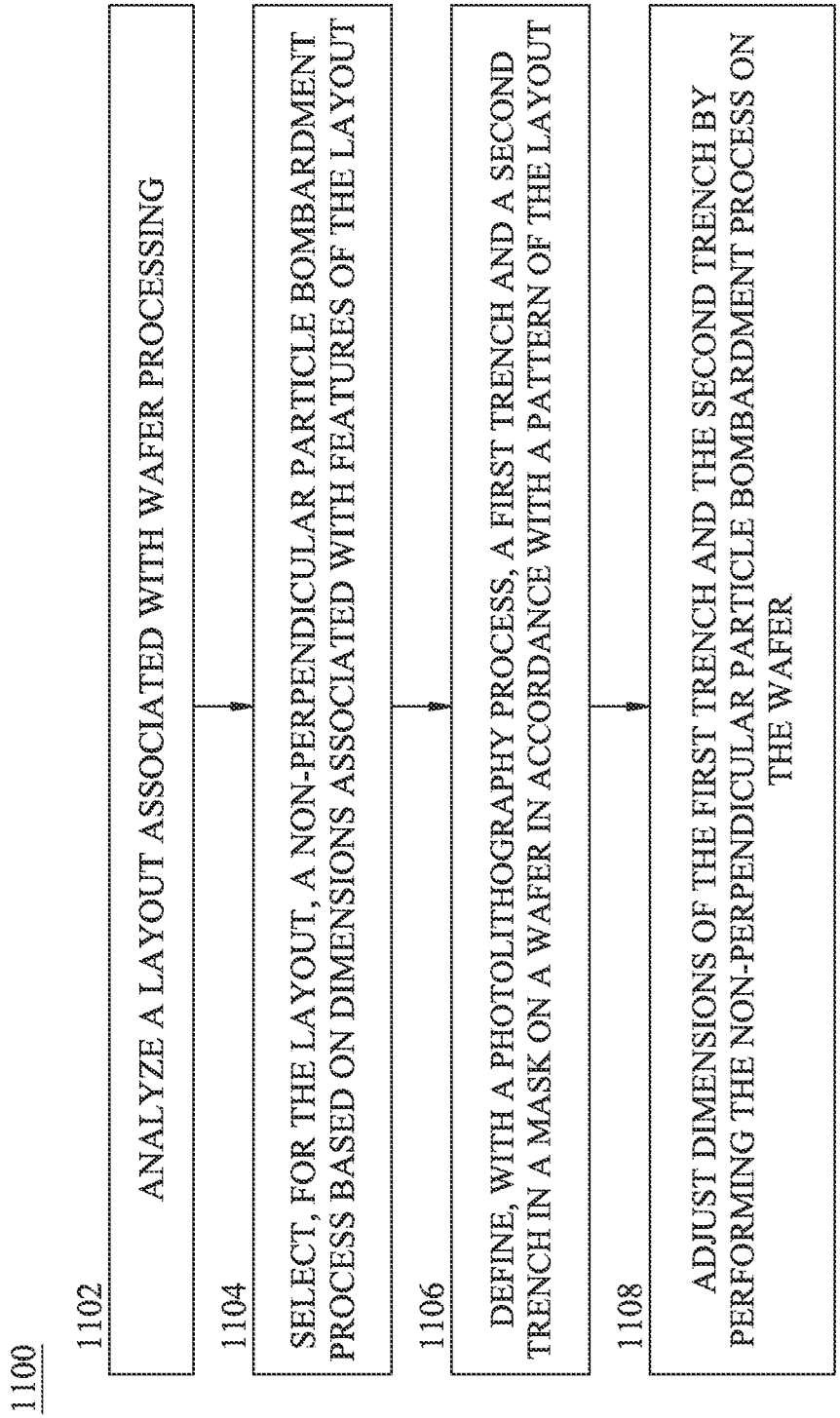
FIG. 11 is a flow diagram of a method for operating a semiconductor processing system, in accordance with some embodiments.

FIG. 11 is a flow diagram of a method 1100, in accordance with some embodiments. The method 1100 can utilize systems, processes, and structures described in relation to FIGS. 1-10. At 1102, the method 1100 includes analyzing a layout associated with wafer processing. One example of a layout is the layout 112 of FIG. 1. At 1104, the method 1100 includes selecting, for the layout, a non-perpendicular particle bombardment process based on dimensions associated with features of the layout. At 1106, the method 1100 includes defining, with a photolithography process, a first trench and a second trench in a mask on a wafer in accordance with a pattern of the layout. One example of first and second trenches are the trenches 154 of FIG. 3C. One example of a mask is the photoresist 152 of FIG. 3C. One example of a wafer is the wafer 102 of FIG. 1. At 1108, the method 1100 includes adjusting dimensions of the first trench and the second trench by performing the non-perpendicular particle bombardment process on the wafer.

Embodiments of the present disclosure provide a semiconductor process system that selects among different patterning processes for each of a plurality of layouts to be utilized in processing semiconductor wafers. The semiconductor process system includes a layout database and a layout analyzer. The layout database includes the layout data associated with various stages of semiconductor processing. The layout analyzer analyzes the distribution and dimensions of features associated with each layout. The layout analyzer compares the layout feature data to selection rules data. The selection rules data determines whether to utilize a non-perpendicular particle bombardment process in addition to a photolithography process to define features associated with the layout. If the non-perpendicular particle bombardment process is selected for a layout, the layout is adjusted to reduce the dimensions between some of the features.

The layout analysis and process selection has various benefits. For example, the non-perpendicular ion-bombardment process can be utilized to overcome pattern scaling limitations of photolithography processes. The result is that layouts are improved, layout features are properly and reliably imparted to wafers, and wafer yields increase.

In some embodiments, a method includes storing layout data associated with a first layout for a wafer and extracting, from the layout data, feature data indicating dimensions associated with features of the first layout. The method includes comparing the feature data to selection rules and selecting a non-perpendicular particle bombardment process for implementing the first layout in the wafer responsive to the feature data satisfying the selection rules.

In some embodiments, a method includes analyzing a layout associated with wafer processing and selecting, for the layout, a non-perpendicular particle bombardment process based on dimensions associated with features of the layout. The method includes defining, with a photolithography process, a first trench and a second trench in a mask on a wafer in accordance with a pattern of the layout and adjusting dimensions of the first trench and the second trench by performing the non-perpendicular particle bombardment process on the wafer.

In some embodiments, a device includes a substrate, a first metal line in the substrate extending in a first direction and having a first rounded end, and a second metal line in the substrate extending in the first direction in line with the first metal line and having a second rounded end separated from the first rounded end by an end-to-end separation distance. The device includes a third metal line in the substrate extending in the first direction and separated from the first metal line in a second direction perpendicular to the first direction by a side-to-side separation distance greater than or equal to the end-to end separation distance.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   storing layout data associated with a first layout for a wafer;
   extracting, from the layout data, feature data indicating dimensions associated with features of the first layout;
   comparing the feature data to selection rules; and
   selecting a non-perpendicular particle bombardment process for implementing the first layout in the wafer responsive to the feature data satisfying the selection rules;
   defining, with a photolithography process, a first trench, a second trench, and a third trench in a mask on the wafer in accordance with a pattern of the layout;
   adjusting dimensions of the first trench and the second trench by performing the non-perpendicular particle bombardment process on the wafer; and
   forming a first metal line in a substrate below the mask based on the first trench, a second metal line in the substrate below the mask based on the second trench, and a third metal line in the substrate below the mask based on the third trench.

2. The method of claim 1, further comprising adjusting the first layout responsive to selecting the non-perpendicular particle bombardment process.

3. The method of claim 2, further comprising adjusting a second layout corresponding to a wafer processing stage before or after the first layout responsive to selecting the non-perpendicular particle bombardment process for the first layout.

4. The method of claim 2, wherein adjusting the first layout includes bringing a first conductive via location and a second conductive via location closer together.

5. The method of claim 2, wherein the selection rules include a threshold side-to-side separation distance for adjacent layout features extending the first direction and separated from each other in a second direction perpendicular to the first direction.

6. The method of claim 1, wherein the selection rules include a threshold end-to-end separation distance for adjacent layout features aligned with each other in a first direction.

7. The method of claim 1, wherein the non-perpendicular particle bombardment process is a directional plasma etching process.

8. The method of claim 1, wherein the non-perpendicular particle bombardment process is an ion bombardment process.

9. A method, comprising:
   analyzing a layout associated with wafer processing;
   selecting, for the layout, a non-perpendicular particle bombardment process based on dimensions associated with features of the layout;
   defining, with a photolithography process, a first trench, a second trench, and a third trench in a mask on a wafer in accordance with a pattern of the layout; and
   adjusting dimensions of the first trench and the second trench by performing the non-perpendicular particle bombardment process on the wafer; and
   forming a first metal line in a substrate below the mask based on the first trench, a second metal line in the substrate below the mask based on the second trench, and a third metal line in the substrate below the mask based on the third trench.

10. The method of claim 9, wherein the non-perpendicular particle bombardment process includes reducing an end-to-end separation distance between an end of the first trench and an end of the second trench by bombarding the wafer with particles at a non-perpendicular angle.

11. The method of claim 10, wherein the end of the first trench and the end of the second trench are rounded prior to the non-perpendicular particle bombardment process.

12. The method of claim 11, wherein the end of the first trench and the end of the second trench are not rounded after the non-perpendicular particle bombardment process.

13. The method of claim 10, further comprising:
    extending the first trench, the second trench, and the third trench downward into a substrate below the mask by performing an etching process; and
    forming the first metal line in the first trench in the substrate, the second metal line in the second trench in the substrate, and the third metal line in the third trench by depositing a conductive material in the first, second, and third trenches in the substrate.

14. The method of claim 13, wherein the first metal line includes a rounded end and the second metal line includes a rounded end, wherein the rounded end of the first metal line is separated from the rounded end of the second metal line in a first direction by the end-to-end separation distance.

15. The method of claim 14, wherein the first metal line is separated from the third metal line adjacent to the first metal line in a second direction perpendicular to the first direction by a side-to-side separation distance greater than or equal to the end-to-end separation distance.

16. The method of claim 15, wherein the end-to-end separation distance is less than or equal to 15 nm.

17. The method of claim 9, wherein the mask layer includes photoresist.

18. A method, comprising:
    selecting a non-perpendicular particle bombardment process for implementing the layout in the wafer based on a comparison of selection rules to feature data extracted from layout data associated with a first layout;
    defining, with a photolithography process, a first trench, a second trench, and a third trench in a mask on a wafer in accordance with a pattern of the layout; and
    adjusting dimensions of the first trench and the second trench by performing the non-perpendicular particle bombardment process on the wafer; and
    forming a first metal line in the substrate based on the first trench and extending in a first direction and having a first rounded end;
    forming a second metal line in the substrate based on the second trench and extending in the first direction in line with the first metal line and having a second rounded end separated from the first rounded end by an end-to-end separation distance; and
    forming a third metal line in the substrate based on the third trench extending in the first direction and separated from the first metal line in a second direction perpendicular to the first direction by a side-to-side separation distance greater than or equal to the end-to-end separation distance.

19. The method of claim 18, wherein the end-to-end separation distance is less than or equal to 15 nm.

20. The method of claim 19, wherein the first metal line includes:
    a width in the second direction; and
    an edge adjacent to the third metal line and extending in the first direction, wherein a smallest distance between the rounded end and convergence point of a first line extending from the first edge in the first direction and a second line extending from a tip of the rounded end is greater than or equal to the width of the first metal line divided by four.

* * * * *